(12) United States Patent
Fukushima et al.

(10) Patent No.: US 9,277,657 B2
(45) Date of Patent: Mar. 1, 2016

(54) WIRING BOARD

(71) Applicant: KYOCERA SLC Technologies Corporation, Yasu-shi, Shiga (JP)

(72) Inventors: Hiroyuki Fukushima, Fukuchiyama (JP); Fumio Kumokawa, Hirakata (JP)

(73) Assignee: Kyocera SLC Technologies Corporation, Shiga (JP)

( * ) Notice: Subject to any disclaimer, the term of this patent is extended or adjusted under 35 U.S.C. 154(b) by 25 days.

(21) Appl. No.: 14/222,077

(22) Filed: Mar. 21, 2014

(65) Prior Publication Data

US 2014/0291005 A1 Oct. 2, 2014

(30) Foreign Application Priority Data

Mar. 28, 2013 (JP) ................ 2013-068185

(51) Int. Cl.
| | |
|---|---|
| *H05K 1/11* | (2006.01) |
| *H05K 7/00* | (2006.01) |
| *H05K 3/46* | (2006.01) |
| *H05K 1/02* | (2006.01) |
| *H05K 3/34* | (2006.01) |

(52) U.S. Cl.
CPC ............ *H05K 3/4602* (2013.01); *H05K 1/0271* (2013.01); *H05K 3/3436* (2013.01); *H05K 3/4644* (2013.01); *H05K 2201/096* (2013.01); *H05K 2201/09609* (2013.01); *H05K 2201/09781* (2013.01)

(58) Field of Classification Search
CPC . H05K 3/4602; H05K 1/0271; H05K 3/3436; H05K 2201/09781; H05K 2201/096; H05K 2201/09609; H05K 3/4644
USPC .......................... 361/760, 767, 768, 777, 783; 174/260–262
See application file for complete search history.

(56) References Cited

U.S. PATENT DOCUMENTS

| 6,582,979 B2* | 6/2003 | Coccioli et al. ................ 438/25 |
| 6,611,055 B1* | 8/2003 | Hashemi ....................... 257/706 |
| 2005/0189136 A1* | 9/2005 | Kawasaki et al. ............. 174/255 |
| 2006/0163740 A1* | 7/2006 | Ohno et al. .................... 257/762 |
| 2007/0029106 A1* | 2/2007 | Kato .............................. 174/255 |
| 2007/0045814 A1* | 3/2007 | Yamamoto et al. ........... 257/698 |
| 2007/0125575 A1* | 6/2007 | Inui et al. ...................... 174/262 |
| 2008/0302563 A1* | 12/2008 | Ohsumi ........................ 174/263 |
| 2009/0273073 A1* | 11/2009 | Tachibana et al. ............ 257/692 |

(Continued)

FOREIGN PATENT DOCUMENTS

| JP | 2001-007155 A | 1/2001 |
| JP | 2011-159734 A | 8/2011 |

*Primary Examiner* — Hoa C Nguyen
(74) *Attorney, Agent, or Firm* — Volpe and Koenig, P.C.

(57) ABSTRACT

A wiring board includes a core substrate having a number of through-holes, and buildup insulating layers and buildup wiring layers alternately laminated on upper and lower surfaces of the core substrate, in which a first through-hole group is arranged in a first region in the core board at a first arrangement density, the first region being opposed to the semiconductor element connection pad formation region, a second through-hole group is arranged in a second region at a second arrangement density lower than the first arrangement density, the second region being located in an outer peripheral portion of the core substrate and away from the first region, and a third through-hole group is arranged in a third region at a third arrangement density higher than the second arrangement density, the third region being located between the first region and the second region.

6 Claims, 6 Drawing Sheets

(56) References Cited

U.S. PATENT DOCUMENTS

2012/0043123 A1* 2/2012 Takada et al. ............... 174/258
2012/0153463 A1* 6/2012 Maeda ......................... 257/737
2012/0327626 A1* 12/2012 Horiuchi et al. ............. 361/783
2013/0285204 A1* 10/2013 Saita et al. ................... 257/532

* cited by examiner

PRIOR ART he object is achieved.

WIRING BOARD

FIELD OF INVENTION

The present invention relates to a wiring board for mounting a semiconductor element such as a semiconductor integrated circuit element.

BACKGROUND

As described in JP 2001-7155 A, a flip-chip bonding is conventionally known as a mounting method for mounting a semiconductor element such as a semiconductor integrated circuit element on a wiring board.

As the wiring board used in the flip-chip bonding, a wiring board formed by a buildup method is known. FIG. 4 is a schematic cross-sectional view showing a conventional wiring board 20 formed by the buildup method. FIG. 5 is a horizontal cross-sectional view of the wiring board 20 taken along line I-I in FIG. 4.

As shown in FIG. 4, the conventional wiring board 20 includes buildup insulating layers 12 and buildup wiring layers 13 alternately laminated on upper and lower surfaces of a core substrate 11.

A core conductor layer 14 made of copper foil or a copper plating layer is adhered to the upper and lower surfaces of the core substrate 11. In addition, a number of through-holes 15 are formed so as to extend from the upper surface to the lower surface of the core substrate 11, and the copper plating layer serving as a part of the core conductor layer 14 is adhered to an inside of the through-hole 15. The through-hole 15 is filled with a resin.

A plurality of via-holes 16 are formed in each buildup insulating layer 12. The buildup wiring layer 13 made of a copper plating layer is formed on and adhered to a surface of the buildup insulating layer 12 including the via-holes 16.

The vertically adjacent buildup wiring layers 13, 13 are electrically connected to each other through the via-holes 16. The buildup wiring layer 13 is electrically connected to the through-holes 15. A part of the outermost buildup wiring layer 13 located on a side of an upper surface of the wiring board 20 is formed as circular semiconductor element connection pads 17 which are electrically connected to electrodes T of a semiconductor element S. These semiconductor element connection pads 17 are arranged in a lattice-like form so as to correspond to the electrodes T of the semiconductor element S, in a semiconductor element connection pad formation region A which is a square region corresponding to the semiconductor element S. A part of the outermost buildup wiring layer 13 located on a side of a lower surface of the wiring board 20 is formed as circular external connection pads 18 which are each electrically connected to a wiring conductor of an external electric circuit board (not shown). These external connection pads 18 are arranged in a lattice-like form.

Solder resist layers 19 are adhered to the outermost buildup insulating layer 12 and the buildup wiring layer 13 formed thereon except for the exposed semiconductor element connection pad 17 and external connection pad 18. A soldering bump B is welded to the semiconductor element connection pad 17 which is not covered with the solder resist layer 19. The electrode T of the semiconductor element S is electrically connected to the exposed semiconductor element connection pad 17 through the soldering bump B. The exposed external connection pad 18 which is not covered with the solder resist layer 19 is connected to the wiring conductor of the external electric circuit board (not shown) through a soldering ball.

In the meantime, in order to ensure sufficient power supply from the wiring board 20, many semiconductor elements S have a terminal arrangement in which a number of grounding and power supply electrodes T are provided in a center of its lower surface, and a number of signal electrodes T are provided in an outer peripheral portion of its lower surface.

When such a semiconductor element S is mounted on the wiring board, as shown in FIG. 5, grounding through-holes 15G and power supply through-holes 15P are provided in a region X opposed to the semiconductor element connection pad formation region A, at a high arrangement density. Meanwhile, signal through-holes 15S are provided in an outer peripheral portion of the core substrate 11 outside the region X, at a low arrangement density. Since the grounding through-holes 15G and the power supply through-holes 15P are provided in the region X opposed to the semiconductor element connection pad formation region A, at the high arrangement density, it is possible to connect the grounding semiconductor element connection pad 17 to the grounding through-hole 15G, and the power supply semiconductor element connection pad 17 to the power supply through-hole 15P within a short distance.

Furthermore, the grounding external connection pads 18 and the power supply external connection pads 18 are arranged in a center of the lower surface of the wiring board 20. Thus, it is possible to connect the grounding through-hole 15G to the grounding external connection pad 18, and the power supply through-hole 15P to the power supply external connection pad 18 within a short distance. As a result, an inductance is low in each of current paths for connecting the grounding semiconductor element connection pad 17 to the grounding external connection pad 18, and the power supply semiconductor element connection pad 17 to the power supply external connection pad 18, so that the power can be sufficiently supplied to the semiconductor element S.

As shown in JP 2011-159734 A, according to the conventional wiring board, the arrangement density of the through-holes 15 is higher in the region X of the core substrate which is opposed to the semiconductor element connection pad formation region A, and is lower in the region outside the region X. However, behaviors of thermal expansion and thermal shrinkage, and stiffness differ between the region having the high arrangement density of the through-holes 15 and the region having the low arrangement density thereof. The difference in behaviors of the thermal expansion and thermal shrinkage, and the difference in stiffness become a factor that causes warpage in the wiring board 20 when the electrode T of the semiconductor element S is connected to the semiconductor element connection pad 17 through the soldering bump B.

Therefore, when the semiconductor element S is mounted on the conventional wiring board 20, the upper surface of the wiring board 20 is warped and recessed warpage is generated as shown in FIG. 6. When such recessed warpage is generated, a distance is reduced between the electrode T of the semiconductor element S and the semiconductor element connection pad 17 formed in an outer peripheral portion in the semiconductor element connection pad formation region A, so that the soldering bump B is severely crushed. When the soldering bumps B adjacent to each other are severely crushed, these soldering bumps B come in contact with each other to cause an electrical short circuit. As a result, the semiconductor element S cannot be normally operated.

SUMMARY

An object of the present invention is to provide a wiring board in which a soldering bump is not severely crushed when an electrode of a semiconductor element is connected to a semiconductor element connection pad through the soldering bump, so that an electrical short circuit is not caused between the soldering bumps, and the mounted semiconductor element can be normally operated.

A wiring board of the present invention includes a core substrate having a number of through-holes, and buildup insulating layers and buildup wiring layers alternately laminated on upper and lower surfaces of the core substrate. The wiring board has a semiconductor element connection pad formation region including a number of semiconductor element connection pads made of the buildup wiring layer and arranged in a center of an upper surface in a lattice-like form, in which a first through-hole group is arranged in a first region in the core substrate at a first arrangement density, the first region being opposed to the semiconductor element connection pad formation region, a second through-hole group is arranged in a second region at a second arrangement density lower than the first arrangement density, the second region being located in an outer peripheral portion of the core substrate and away from the first region, and a third through-hole group is arranged in a third region at a third arrangement density higher than the second arrangement density, the third region being located between the first region and the second region.

According to the wiring board of the present invention, the third through-hole group is arranged in the third region located between the first region and the second region, at the third arrangement density higher than the second arrangement density. Thus, behaviors of thermal expansion and thermal shrinkage and a position of a stiffness change due to the difference in arrangement density of the through-holes are provided in a region away from the semiconductor element connection pad formation region. As a result, when the electrode of the semiconductor element is connected to the semiconductor element connection pad through the soldering bump, an impact on the semiconductor element connection pad formation region becomes small, and warpage can be made small in the semiconductor element connection pad formation region. As a result, it is possible to prevent the distance from being reduced between the electrode of the semiconductor element and the semiconductor element connection pad provided in an outer peripheral portion, so that the soldering bump is not severely crushed. Therefore, an electrical short circuit is not caused between the adjacent soldering bumps, and the mounted semiconductor element can be normally operated.

DETAILED DESCRIPTION OF THE PREFERRED EMBODIMENTS

Figure 1:
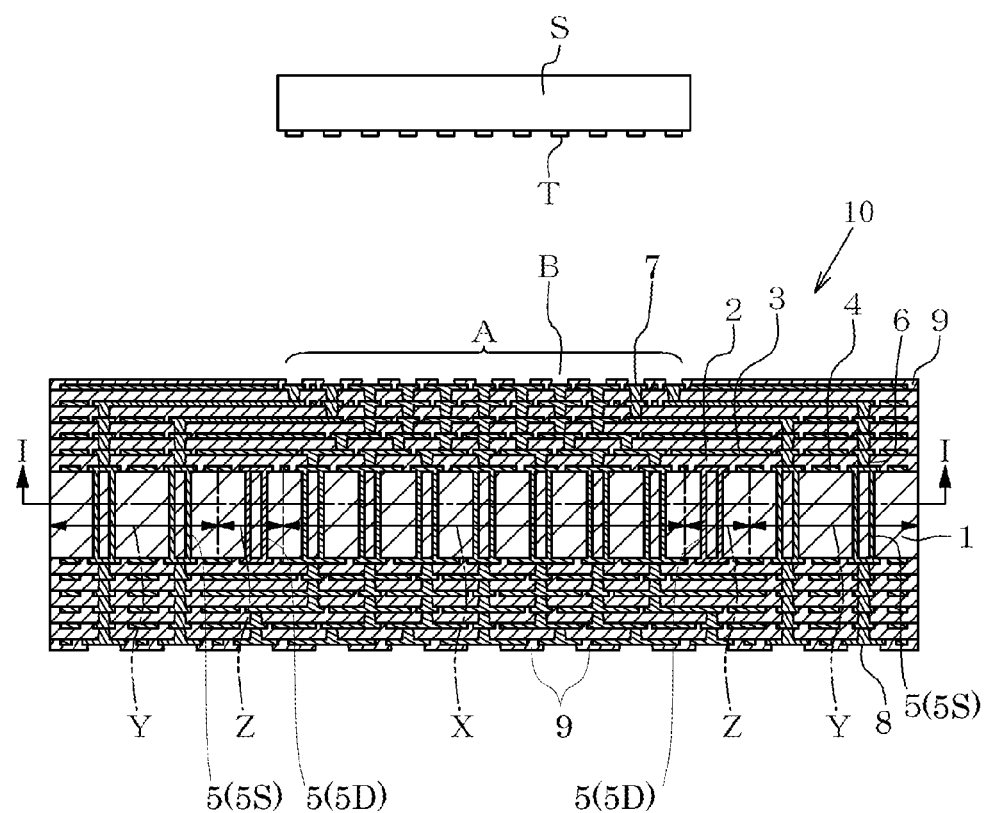
FIG. 1 is a schematic cross-sectional view showing one embodiment of a wiring board according to the present invention.
Figure 2:
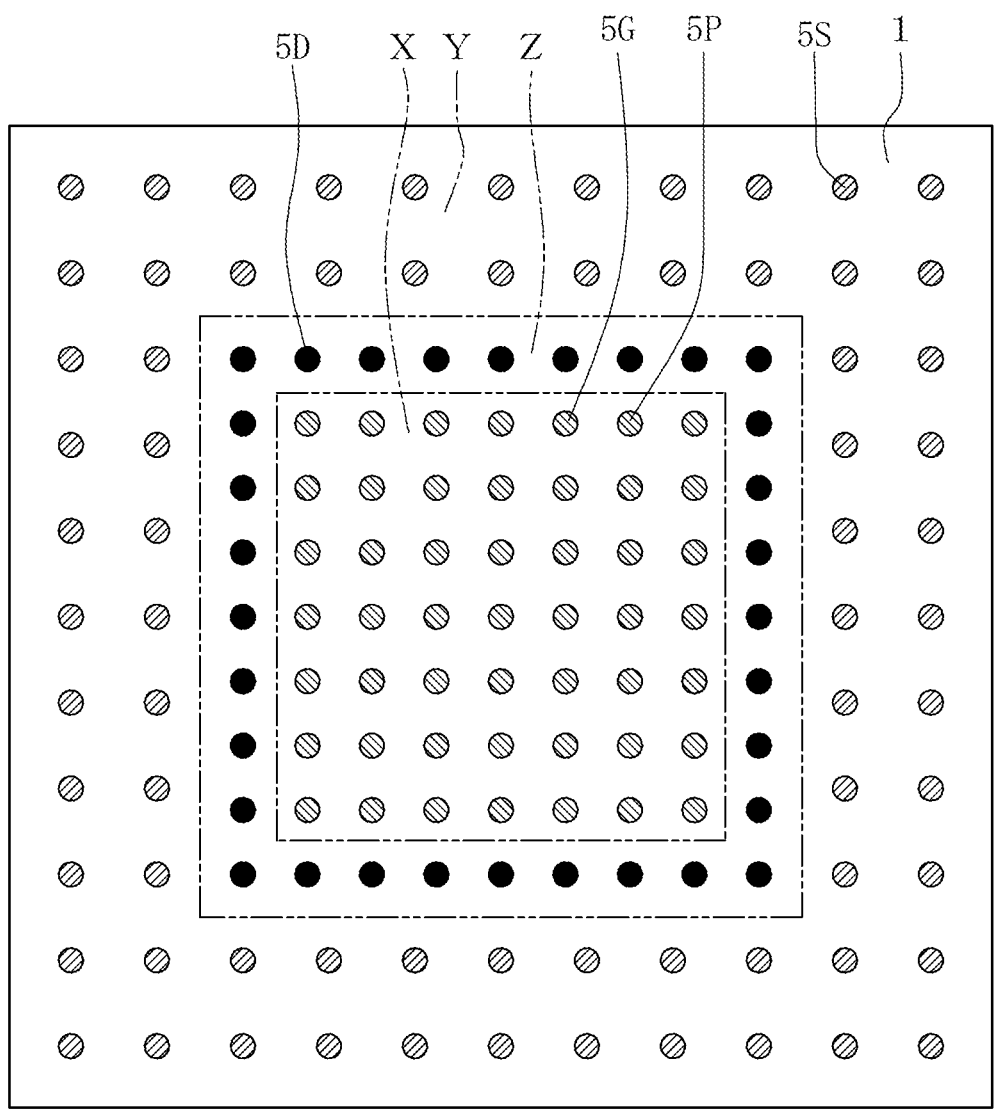
FIG. 2 is a horizontal cross-sectional view taken along line I-I in FIG. 1.

Hereinafter, a wiring board according to the present invention will be described in detail with reference to the drawings. FIG. 1 is a schematic cross-sectional view showing a wiring board 10 according to one embodiment of the present invention. FIG. 2 is a horizontal cross-sectional view taken along line I-I in FIG. 1.

As shown in FIG. 1, the wiring board 10 includes a core substrate 1, and a plurality of buildup insulating layers 2 and a plurality of buildup wiring layers 3 which are alternately laminated on upper and lower surfaces of the core substrate 1.

The core substrate 1 has a thickness of about 50 μm to 800 μm. The core substrate 1 is an insulating board made of an electric insulating material obtained by impregnating glass cloth having glass fiber bundles woven vertically and horizontally, with a thermosetting resin such as a bismaleimide triazine resin or an epoxy resin. A core conductor layer 4 made of copper foil or a copper plating layer is adhered to the upper and lower surfaces of the core substrate 1. A number of through-holes 5 are formed so as to extend from the upper surface to the lower surface of the core substrate 1 (insulating board), and the copper plating layer serving as a part of the core conductor layer 4 is adhered to an inner peripheral surface of the through-hole 5. The through-hole 5 has a diameter of about 100 μm to 300 μm. The through-hole 5 is filled with a resin.

The buildup insulating layer 2 has a thickness of about 20 μm to 50 μm. The buildup insulating layer 2 is made of an electric insulating material obtained by dispersing an inorganic insulating filler such as a silicon oxide into a thermosetting resin such as an epoxy resin. Each buildup insulating layer 2 is provided with a plurality of via-holes 6 each having a diameter of about 35 μm to 100 μm.

The buildup wiring layer 3 is adhered to a surface of the buildup insulating layer 2 and an inner surface of the via-hole 6. The buildup wiring layer 3 is electrically connected to the through-hole 5.

Circular semiconductor element connection pads 7 are formed as a part of the outermost buildup wiring layer 3 located on a side of the upper surface of the wiring board 10. These semiconductor element connection pads 7 are arranged in a lattice-like form. An outer peripheral portion of the semiconductor element connection pad 7 is covered with a solder resist layer 9. A center of an upper surface of the semiconductor element connection pad 7 is not covered with the solder resist layer 9 so as to be exposed. The exposed portion of the semiconductor element connection pad 7 is electrically connected to an electrode T of a semiconductor element S through a soldering bump B.

On the other hand, circular external connection pads 8 are formed as a part of the outermost buildup wiring layer 3 located on a side of the lower surface of the wiring board 10. These external connection pads 8 are arranged in a lattice-like form. An outer peripheral portion of the external connection pad 8 is covered with the solder resist layer 9. A center of a lower surface of the external connection pad 8 is not covered with the solder resist layer 9 so as to be exposed. The exposed part of the external connection pad 8 is electrically connected to a wiring conductor of an external electric circuit board (not shown) through a soldering ball. The solder resist layer 9 protects the outermost buildup wiring layer 3, and defines the exposed portions of each of the semiconductor element connection pads 7 and the external connection pads 8.

In order to ensure sufficient power supply from the wiring board 10, the semiconductor element S has a terminal arrangement in which a number of grounding and power supply electrodes T are provided in a center of its lower surface, and a number of signal electrodes T are provided in an outer peripheral potion of its lower surface.

According to the wiring board 10 for mounting the semiconductor element S, as shown in FIG. 2, a number of grounding through-holes 5G and a number of power supply through-holes 5P (first through-hole group) are provided in a first region X opposed to a semiconductor element connection pad formation region A, at a high arrangement density (first arrangement density).

A number of signal through-holes 5S (second through-hole group) are provided in a second region Y, which is located in an outer periphery of the core substrate 1 and away from the first region X, at an arrangement density (second arrangement density) lower than the arrangement density (first arrangement density) of the through-holes 5G and 5P in the first region X.

Since the grounding through-holes 5G and the power supply through-holes 5P are provided in the first region X at the high arrangement density, it is possible to connect the grounding semiconductor element connection pad 7 to the grounding through-hole 5G, and the power supply semiconductor element connection pad 7 to the power supply through-hole 5P within a short distance.

The grounding external connection pad 8 and the power supply external connection pad 8 are arranged in a center of a lower surface of the wiring board 10. Thus, it is possible to connect the grounding through-hole 5G to the grounding external connection pad 8, and the power supply through-hole 5P to the power supply external connection pad 8 within a short distance.

As a result, an inductance is low in each of current paths for connecting the grounding semiconductor element connection pad 7 to the grounding external connection pad 8, and the power supply semiconductor element connection pad 7 to the power supply external connection pad 8, so that the power can be sufficiently supplied to the semiconductor element S.

In the core substrate 1 of the wiring board 10, dummy through-holes 5D (third through-hole group) are provided in a third region Z located between the first region X and the second region Y. It is preferable that an arrangement density (third arrangement density) of the dummy through-holes 5D is higher than the arrangement density of the through-holes 5S in the second region Y, and is equal to or smaller than the arrangement density of the through-holes 5G and 5P in the first region X. The dummy through-hole 5D is not electrically connected to the via-hole 6.

An arrangement pitch of the through-holes 5 in the third region Z is preferably 1.6 times or less with respect to an arrangement pitch of the through-holes 5G and 5P in the region X. The arrangement pitch is a pitch of the through-holes 5 in a vertical direction and a horizontal direction in a plane shown in FIG. 2.

In the core substrate 1, the dummy through-holes 5D are provided in the third region Z located between the first region X and the second region Y, at the arrangement density (third arrangement density) higher than the arrangement density (second arrangement density) of the through-holes 5S arranged in the second region Y. Thus, behaviors of thermal expansion and thermal shrinkage, and a position of a stiffness change due to a difference in arrangement density of the through-holes 5 are provided away from the region X corresponding to the semiconductor element connection pad formation region A.

Figure 3:
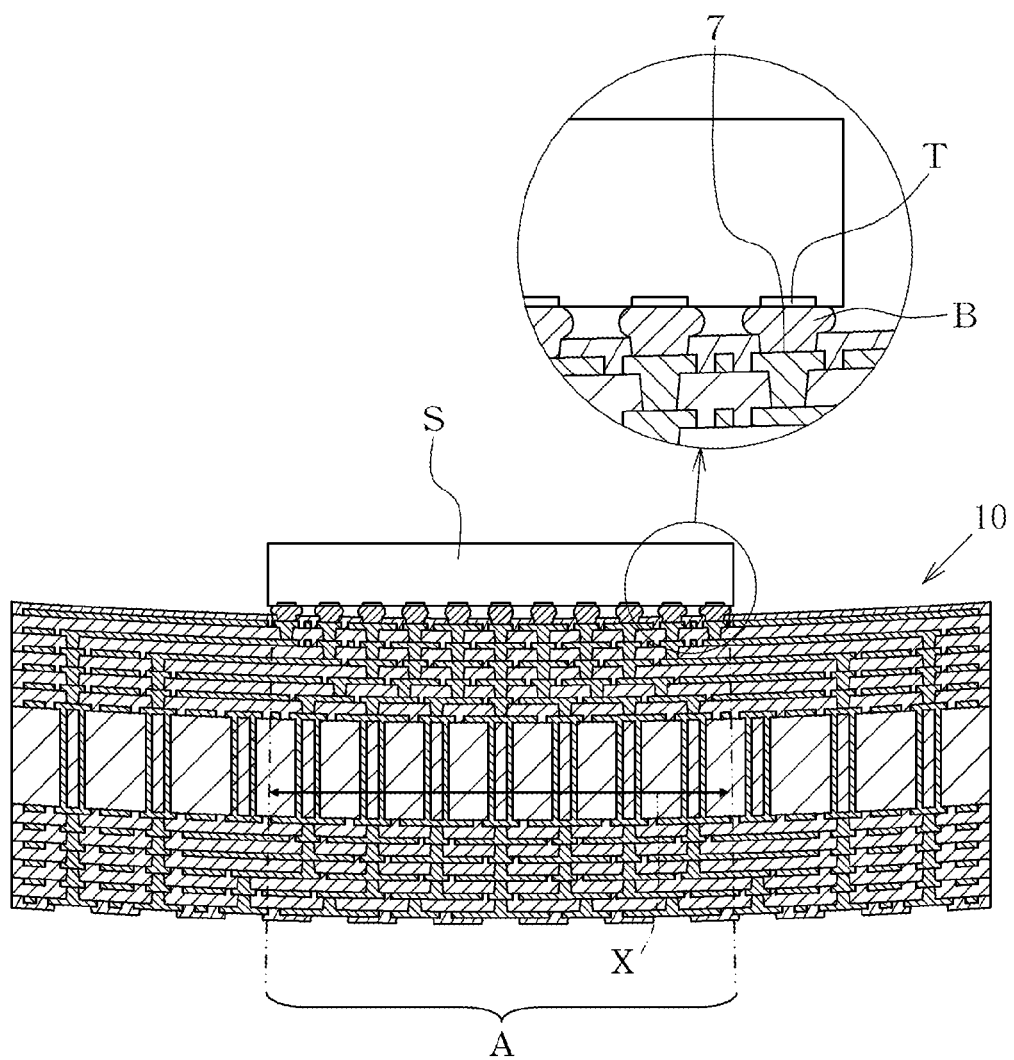
FIG. 3 is a schematic cross-sectional view showing a state in which a semiconductor element is mounted on the wiring board according to the one embodiment of the present invention.
Figure 4:
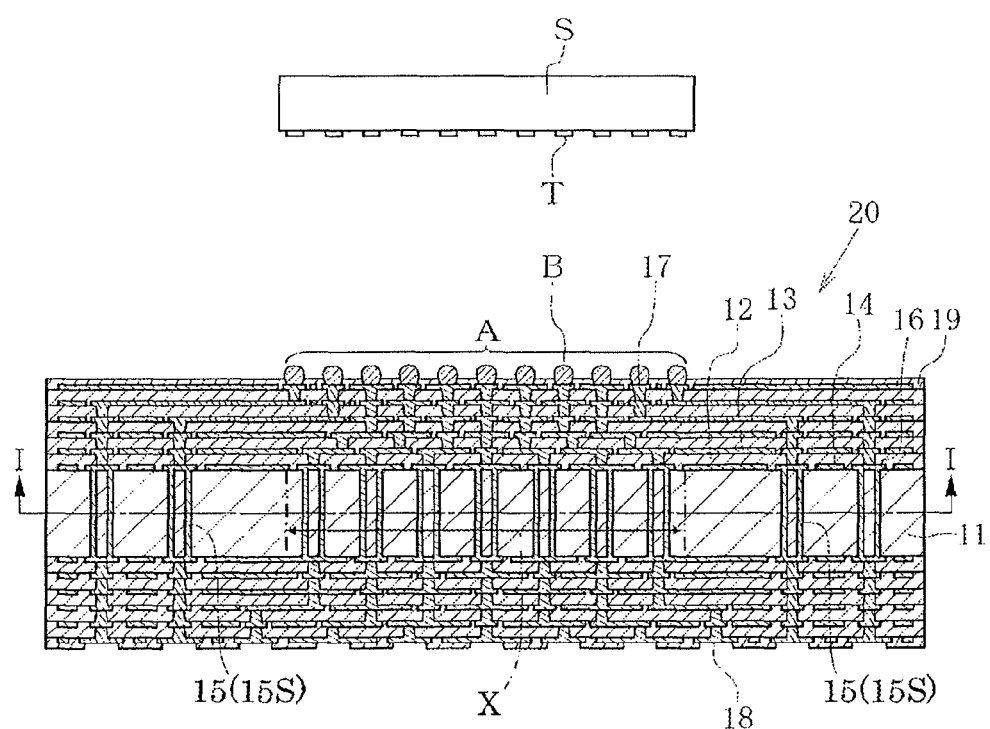
FIG. 4 is a schematic cross-sectional view showing a conventional wiring board.
Figure 5:
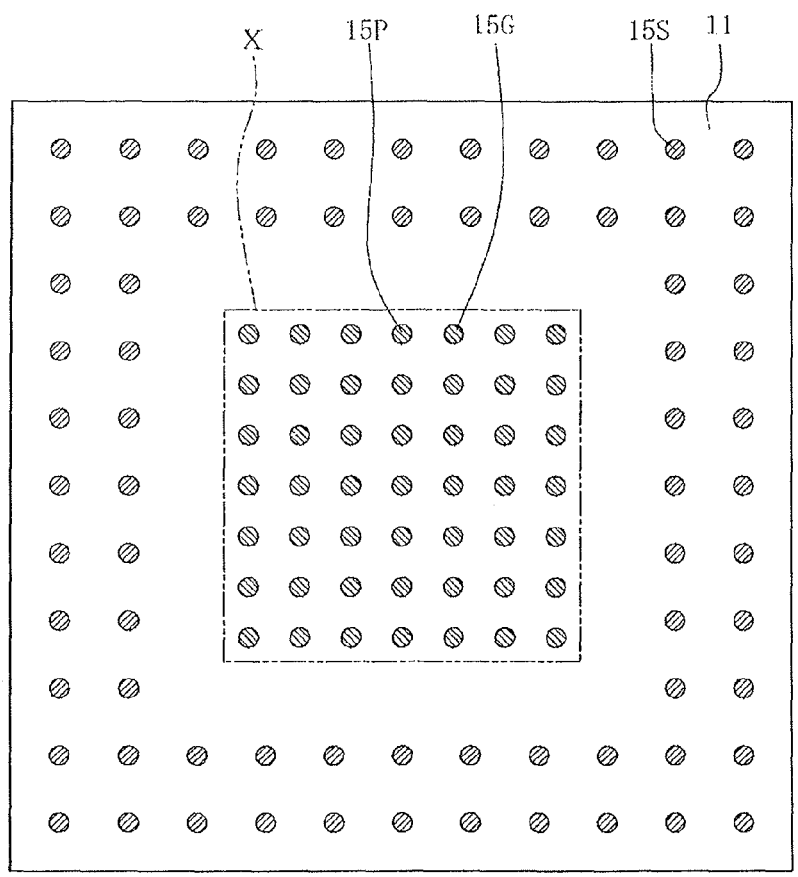
FIG. 5 is a horizontal cross-sectional view taken along line I-I in FIG. 4.
Figure 6:
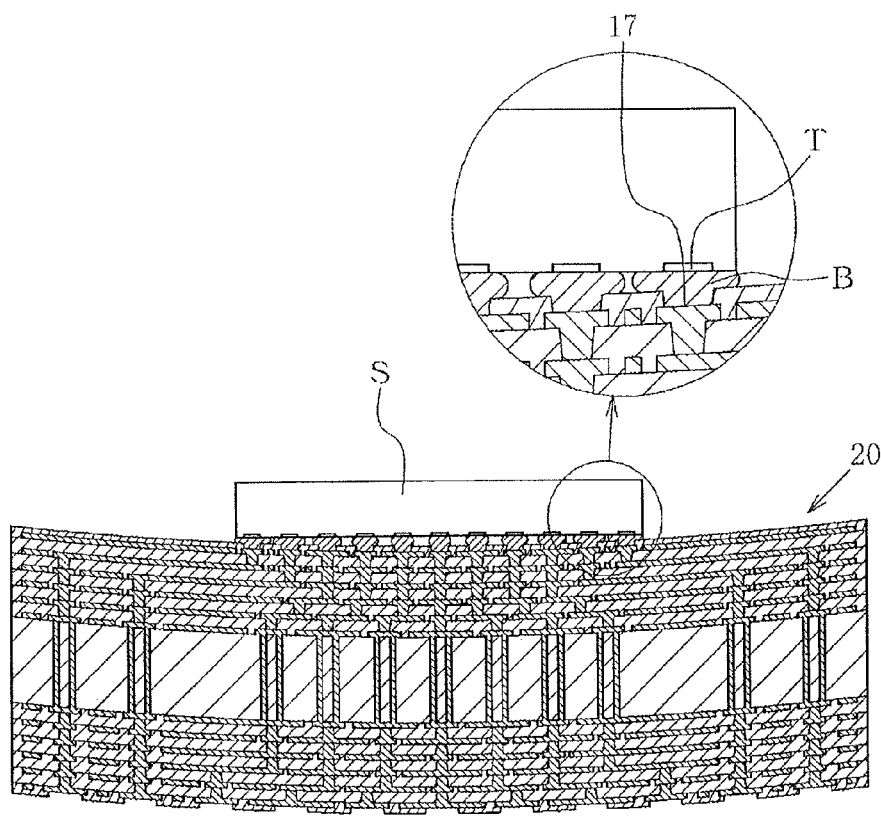
FIG. 6 is a schematic cross-sectional view showing a state in which a semiconductor element is mounted on the conventional wiring board.

As described above, the behaviors of the thermal expansion and thermal shrinkage and the position of the stiffness change due to the difference in arrangement density of the through-holes 5 are provided away from the first region X corresponding to the semiconductor element connection pad formation region A. Thus, as shown in FIG. 3, when the electrode T of the semiconductor element S is connected to the semiconductor element connection pad 7 through the soldering bump B, an impact on the semiconductor element connection pad formation region A becomes small, and warpage can be made small in the semiconductor element connection pad formation region A. As a result, it is possible to prevent the distance from being reduced between the electrode T of the semiconductor element S and the semiconductor element connection pad 7 in the outer peripheral portion, so that the soldering bump B is not severely crushed. Therefore, according to the wiring board 10, an electrical short circuit is not caused between the adjacent soldering bumps B, and the mounted semiconductor element S can be normally operated.

The dummy through-hole 5D may be electrically independent, or may be electrically connected to a grounding potential or a power supply potential. The through-hole 5 may be filled with copper plating instead of being filled with the resin.

What is claimed is:
1. A wiring board comprising:
a core substrate having a number of through-holes; and
buildup insulating layers and buildup wiring layers alternately laminated on upper and lower surfaces of the core substrate, the wiring board having a semiconductor element connection pad formation region where a number of semiconductor element connection pads made of the buildup wiring layer are arranged in a lattice-like form in a center of an upper surface, wherein
a first through-hole group is arranged in a first region in the core substrate at a first arrangement density, the first region being opposed to the semiconductor element connection pad formation region,
a second through-hole group is arranged in a second region at a second arrangement density lower than the first arrangement density, the second region being located in an outer peripheral portion of the core substrate and away from the first region, and
a third through-hole group is arranged in a third region at a third arrangement density higher than the second arrangement density, the third region being located between the first region and the second region.
2. The wiring board according to claim 1, wherein
external connection pads made of the buildup wiring layer are arranged in a center of a lower surface.
3. The wiring board according to claim 1, wherein
the third arrangement density is equal to or smaller than the first arrangement density.
4. The wiring board according to claim 1, wherein
the first through-hole group includes a grounding through-hole and a power supply through-hole.
5. The wiring board according to claim 1, wherein
the second through-hole group includes a signal through-hole.
6. The wiring board according to claim 1, wherein
the third through-hole group includes a dummy through-hole.

* * * * *